(12) United States Patent
McCallister et al.

(10) Patent No.: US 11,960,767 B2
(45) Date of Patent: Apr. 16, 2024

(54) OUTER CODES FOR DATA STORAGE DEVICES

(71) Applicant: Seagate Technology LLC, Fremont, CA (US)

(72) Inventors: Ryan P. McCallister, Erie, CO (US); Ara Patapoutian, Hopkinton, MA (US); Mark A. Gaertner, Vadnais Heights, MN (US); Ian Davies, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/689,386

(22) Filed: Mar. 8, 2022

(65) Prior Publication Data

US 2023/0289095 A1    Sep. 14, 2023

(51) Int. Cl.
*G06F 3/06* (2006.01)
*H03M 13/15* (2006.01)

(52) U.S. Cl.
CPC .......... *G06F 3/0659* (2013.01); *G06F 3/0604* (2013.01); *G06F 3/0619* (2013.01); *G06F 3/0635* (2013.01); *G06F 3/0689* (2013.01); *H03M 13/1515* (2013.01)

(58) Field of Classification Search
CPC .... G06F 3/0659; G06F 3/0635; G06F 3/0604; G06F 3/0689; G06F 3/0619; H03M 13/1515
See application file for complete search history.

(56) References Cited

U.S. PATENT DOCUMENTS

| | | | |
|---|---|---|---|
| 5,522,065 A * | 5/1996 | Neufeld | G06F 11/1076 711/100 |
| 7,814,398 B2 | 10/2010 | Djurdjevic et al. | |
| 8,589,725 B2 * | 11/2013 | Takada | G11B 20/1803 714/6.24 |
| 8,719,621 B1 * | 5/2014 | Karmarkar | G06F 11/108 714/6.24 |
| 9,356,626 B2 | 5/2016 | Alexeev et al. | |
| 10,382,065 B1 | 8/2019 | Sridhara et al. | |
| 10,853,187 B2 | 12/2020 | Arslan et al. | |
| 11,042,439 B1 | 6/2021 | Sridhara et al. | |
| 11,151,056 B2 * | 10/2021 | Shveidel | G06F 3/0665 |
| 2022/0301590 A1 * | 9/2022 | Furuhashi | G11B 20/1833 |
| 2023/0197112 A1 * | 6/2023 | Maeto | G11B 5/09 369/275.3 |

* cited by examiner

*Primary Examiner* — Mark A Giardino, Jr.
(74) *Attorney, Agent, or Firm* — Faegre Drinker Biddle & Reath LLP (57) ABSTRACT

A method includes receiving, by a data storage device, a read command. The method further includes reading a first set of outer code stored to a magnetic recording medium of the data storage device and storing the first set of outer code to memory. The method further includes receiving a write command to write data to the magnetic recording medium and writing a second set of outer code to the magnetic recording medium in connection with the write command.

18 Claims, 7 Drawing Sheets

OUTER CODES FOR DATA STORAGE DEVICES

SUMMARY

In certain embodiments, a method includes receiving, by a data storage device, a read command. The method further includes reading a first set of outer code stored to a magnetic recording medium of the data storage device, in response to the read command, and storing the first set of outer code to memory. The method further includes receiving, by the data storage device, a write command to write data to the magnetic recording medium and writing a second set of outer code to the magnetic recording medium in connection with the write command.

In certain embodiments, a host data storage system includes multiple hard disk drives each comprising a respective magnetic recording medium. The respective magnetic recording media each comprise multiple data tracks with user data portions and outer code sectors, and lengths of the outer code sectors are equal to each other.

In certain embodiments, a system-on-a-chip including a read/write channel that is configured to: receive a read command for a first set of user data stored to a magnetic recording medium; in response to the read command, store the first set of user data in memory and store outer code associated with the user data in the memory; receive a write command for a second set of user data; and generate updated outer code based, at least in part, on the first and second sets of user data and the outer code.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

To read data from magnetic recording media, hard disk drives use magnetic sensors—sometimes referred to as readers, read heads, or read transducers—to detect magnetic transitions written to the magnetic recording media (e.g., the hard disks). When processing the data detected by (or read by) the magnetic sensors, hard disk drives may detect that a read error has occurred.

To correct the detected error, hard disk drives are programmed to carry out various error-recovery approaches. One approach uses what are referred to as outer codes. Outer codes may be stored on the magnetic recording media and used by the hard disk drive to correct read errors. However, over time, the effectiveness of outer codes can decrease unless the outer codes are updated to maintain parity. This maintenance of parity can consume resources in hard disk drives which can negatively affect performance. Certain embodiments of the present disclosure are accordingly directed to methods and devices for error correction that use new approaches for maintaining outer codes. In particular, among other things, certain embodiments involve updating outer codes in connection with other operations such that hard disk drives do not necessarily perform operations dedicated to just maintaining outer codes.

Figure 1:
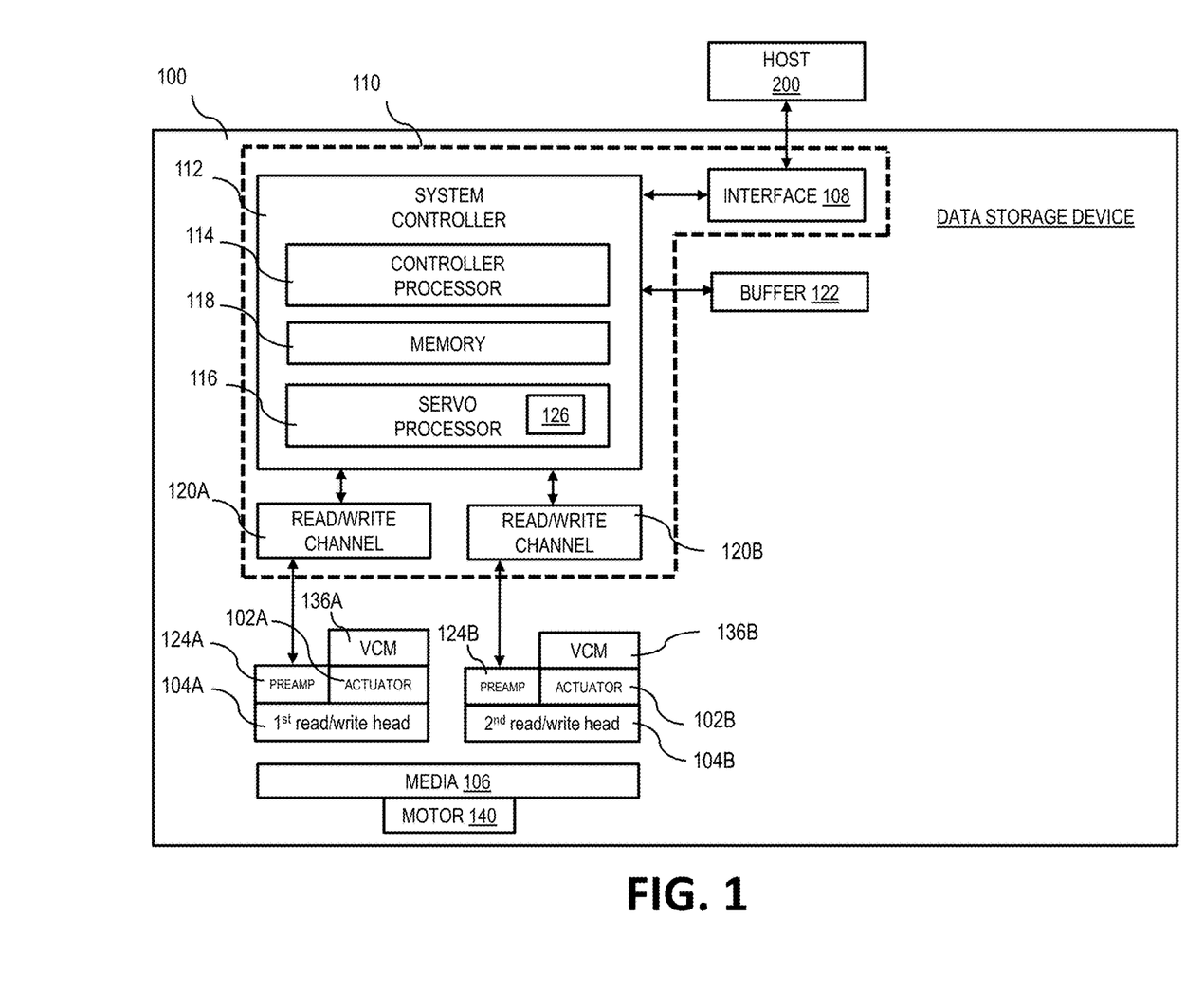
FIG. 1 shows a block diagram of a data storage device, in accordance with certain embodiments of the present disclosure.

FIG. 1 shows a schematic of a data storage device 100 such as a hard disk drive. In the case of a hard disk drive, the data storage device 100 can include one or more actuators (i.e., a first actuator 102A and a second actuator 102B) each with one or more read/write heads 104A and 104B to provide concurrent access to magnetic recording media 106 (e.g., magnetic recording disks, which are referred to as a magnetic recording medium in singular form). In certain embodiments, the actuators 102A and 102B share a common pivot axis and are positioned in a stacked arrangement. In such embodiments, the read/write head(s) 104A coupled to the first actuator 102A access different surfaces of the magnetic recording media 106 than the read/write head(s) 1046 coupled to the second actuator 102B. In other embodiments, the actuators 102A and 102B have separate pivot axes. In such embodiments, the read/write head(s) 104A coupled to the first actuator 102A can access the same magnetic recording medium 106 as the read/write head(s) 104B coupled to the second actuator 102B. Although only two actuators for the data storage device 100 are shown in FIG. 1, additional actuators can be incorporated into the data storage device 100 or the data storage device 100 may have only one actuator. The read/write heads 104A and 1046 can each comprise a slider with one or more read transducers (e.g., readers, read head, magnetic sensors) and one or more write transducers (e.g., writers, write head).

The data storage device 100 includes an interface 108 (e.g., an input/output interface) for transferring data to and from the data storage device 100. For example, the interface 108, among other features, can be communicatively coupled between a host 200 (shown in more detail in FIG. 2) and the read/write heads 104A and 1046 to facilitate communication, using a standardized communication protocol (e.g., SATA, SAS, SCSI), between the read/write heads 104A and 1046 and the host 200.

The data storage device 100 can include a system on a chip ("SOC") 110 (shown in dashed lines) that includes a system controller 112, which can include a controller processor 114 (e.g., a microprocessor), a servo processor 116 (e.g., a microprocessor), and memory 118 coupled to the controller processor 114 and the servo processor 116. The SOC 110 can include multiple distinct banks of memory. For example, one bank of memory 118 can be dedicated to the controller processor 114 and its functions while another bank of memory 118 can be dedicated to the servo processor 116 and its functions (e.g., the memory 118 and the servo processor 116 together functioning as a servo controller 126). The interface 108 may also be part of the SOC 110.

The SOC 110 can also include one or more read/write channels 120A and 120B, which encode and decode data associated with write commands and with read commands. The SOC 110 may be an integrated circuit such as an application-specific integrated circuit ("ASIC") and field-programmable gate array ("FPGA") that includes instructions (e.g., in the form of firmware) for carrying out various functions of the data storage device 100. For example, the SOC 110 can include circuitry to control and carry out various aspects of the data storage device 100 as described in more detail below. Although the interface 108, system controller 112, etc., are shown as being part of a single SOC, the components and their functions can be distributed among several integrated circuits. The system controller 112 can be coupled to and control access to a buffer 122, which can temporarily store data associated with read commands and write commands. The buffer 122 can be a volatile memory, such as a dynamic random access memory ("DRAM"), static random access memory ("SRAM"), or other volatile memory.

During operation, the data storage device 100 receives various data transfer commands (e.g., a read command or a write command) from the host 200. Data associated with a write command may be received from the host 200 by the interface 108 and initially stored to the buffer 122. The data is encoded or otherwise processed by respective read/write channels 120A or 120B and eventually stored to the magnetic recording media 106 via one of the read/write heads 104A or 104B coupled to the respective first actuator 102A or the second actuator 102б. Data associated with a read command may be retrieved from the magnetic recording media 106, processed by one of the read/write channels 120A or 120B, and stored in the buffer 122. Such data is then transferred to the host 200 by the interface 108. In certain embodiments, the servo processor 116 controls operations of respective pre-amplifiers 124A and 124B, which provide signals to the respective read/write heads 104A and 104B for writing magnetic transitions to the magnetic recording media 106 and for receiving signals from the respective read/write heads 104A and 104B in response to detecting magnetic transitions written to the magnetic recording media 106.

The data storage device 100 includes a servo control system 126 that is carried out by components of the system controller 112 (e.g., the servo processor 116 and one or more banks of the memory 118). The system controller 112 controls current to at least one of the voice coil motor (VCM) assemblies 136A, 136B and—for some operations—controls voltage to microactuators to position the read/write heads 104A and 104B over the desired track. The VCM assemblies 136A and 136B are used to position (e.g., rotate) the actuators 102A and 102B to position the read/write heads 104A and 104B over a desired data track on the magnetic recording media 106 for data reading and data writing operations.

Figure 2:
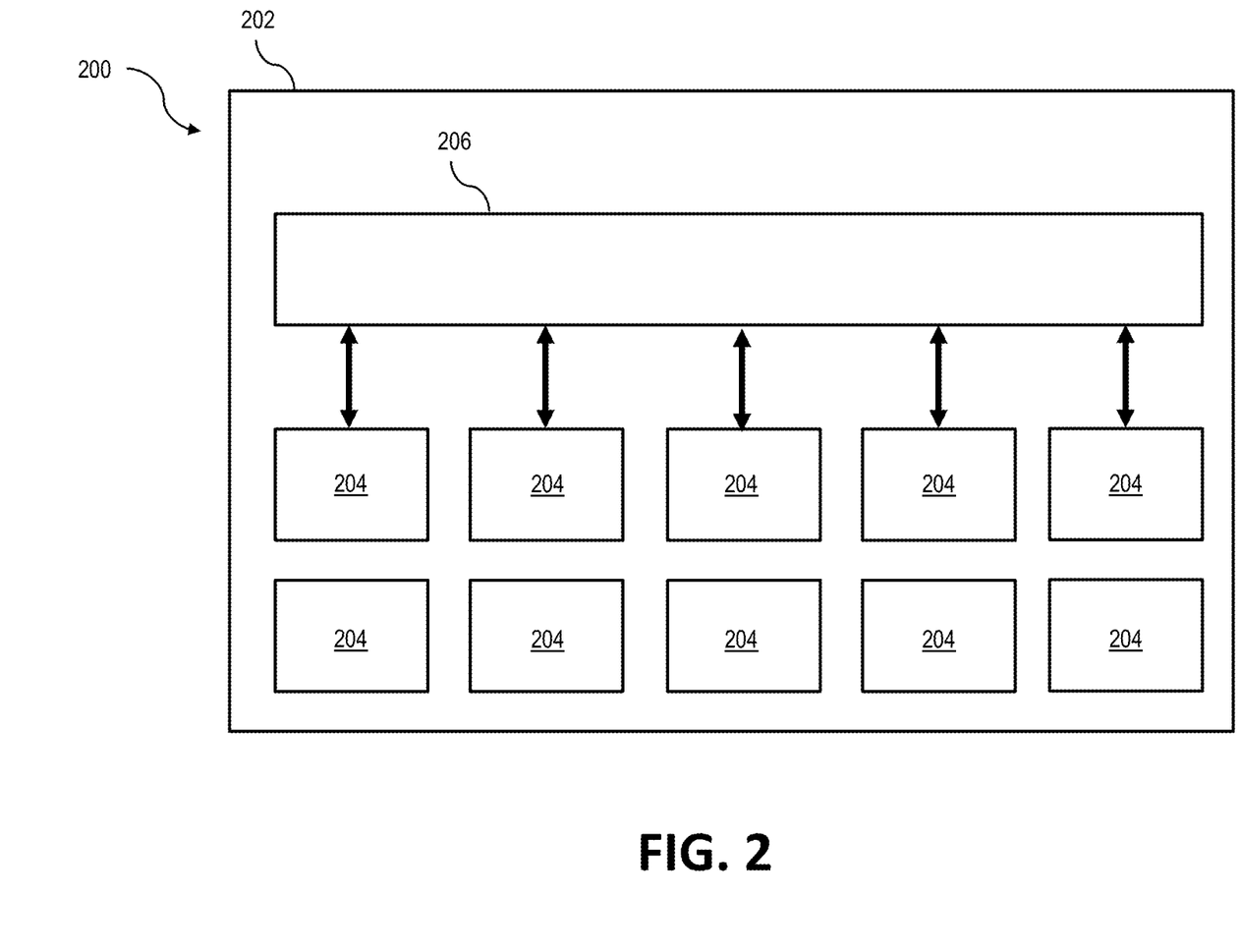
FIG. 2 shows a block diagram of a host data storage system, in accordance with certain embodiments of the present disclosure.

FIG. 2 shows a schematic of the host 200. The host 200 can be a data storage system such as a server. The host 200 can include an enclosure 202 (e.g., drawers, cabinets, and the like) that houses data storage devices 204 (e.g., hard disk drives, solid state drives, and/or optical disk drives, and the like) and other components such as power supplies, cooling devices, etc.

Each data storage device 204 can include the same or similar features as the data storage device 100 shown in FIG. 1 and described above. The particular number and types of data storage devices 204 can vary. However, for explanatory purposes, the host 200 in FIG. 2 includes ten data storage devices 204 that are hard disk drives. The host 200 also includes a host controller 206 (hereinafter, the "controller 206") that is communicatively coupled to the data storage devices 204.

Figure 3:
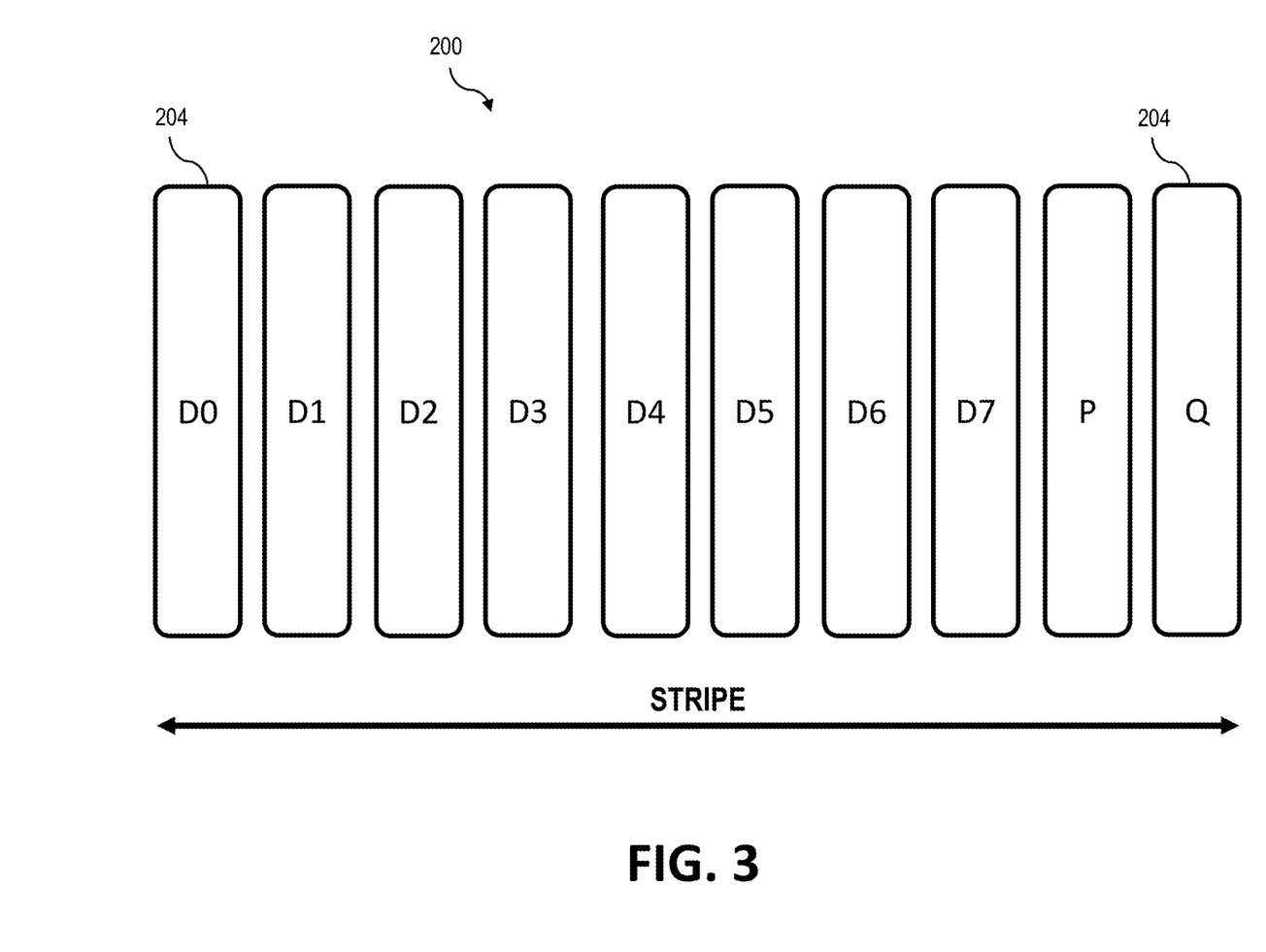
FIG. 3 shows a block diagram of data storage devices of the host of FIG. 2, in accordance with certain embodiments of the present disclosure.

FIG. 3 shows a schematic of the data storage devices 204 of the host 200 of FIG. 2, which can be a redundant array of independent disks (RAID) system. In the example of FIG. 3, the host 200 is programmed to utilize the data storage devices 204 in a RAID-6 configuration, although other configurations can be utilized. In the RAID-6 configuration, eight of the data storage devices 204 are data drives (labeled D0-D7) and two are parity drives (labeled P and Q). These data storage devices 204 represent a stripe, where each stripe is made up of data storage devices 204 each with a chunk size of data. The chunk is a consecutive range of logical block addresses (LBAs)—such that the first N bytes are stored in the data storage device 204 labeled D0, the next N bytes are stored in the data storage device 204 labeled D1, and so on.

In a RAID-6 configuration (and other RAID configurations), the outer code of the host 200 (e.g., the host-level code, not the device-level code) is maintained to have valid parity as new data is stored to the host 200 or modified within the host 200. The approach for maintaining valid parity varies depending on whether data is written such that there is a full stripe write (FSW) or a partial stripe write (PSW).

If data is written such that there is an FSW, parity is calculated on the to-be-written data and all data is written. If the data is written such that there is a PSW, parity is updated by performing a read-modify-write (RMW) operation. An RMW operation involves first reading data already written to the media, modifying that data (e.g., by updating the parity data), and then overwriting the data written to the media with the modified data.

In certain embodiments of the present disclosure, the outer code stored on respective data storage devices 204 is updated in connection with the host 200 updating its outer code. Before explaining how the outer code of the data storage devices 204 is updated, the paragraphs below explain how the outer code is used to correct detected errors.

Outer Code Use

Figure 4:
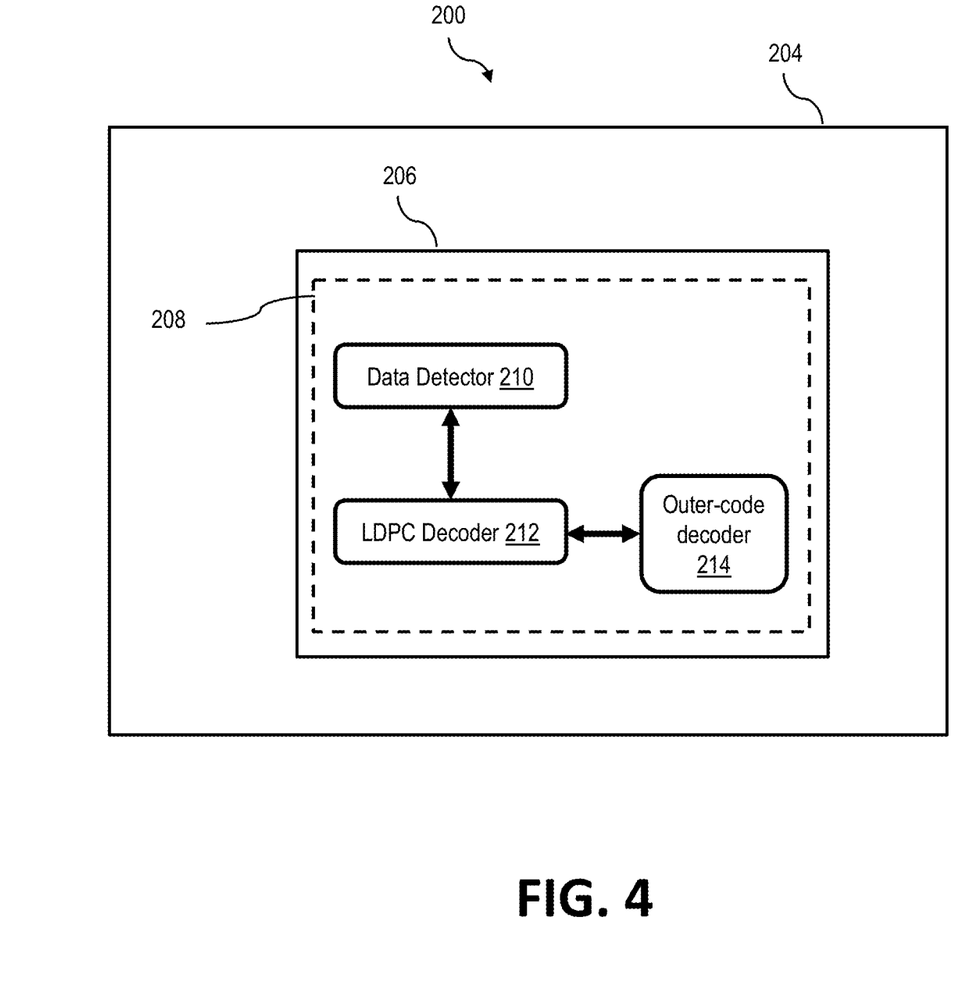
FIG. 4 shows a block diagram of one of the data storage devices and the host of FIG. 2, in accordance with certain embodiments of the present disclosure.

FIG. 4 shows a schematic of one of the data storage devices 204 of the host 200. For brevity, only some of the features of the data storage device 204 are shown in FIG. 4, as compared to the data storage device 100 of FIG. 1.

The data storage device 204 includes an SOC 206, which includes various processors or modules as described above with respect to the data storage device 100 of FIG. 1. In FIG. 4, the SOC 206 includes a read/write channel module 208, which contains a data detector 210 and a low-density parity check (LDPC) decoder 212 (e.g., a soft decoder).

The data detector 210 receives waveforms detected by the magnetic sensor and generates confidence/probabilities. The LDPC decoder 212 can detect that, in the process of reading data from magnetic recording media of the data storage device 204, the data detector 210 encountered errors (e.g., unrecoverable read errors). After errors are detected, the data storage device 204 can initiate various data recovery processes such as attempting to re-read the data track. However, if the various recovery processes cannot correct the detected error (e.g., within a threshold period of time or within a threshold number of attempts), the data storage device 204 (e.g., via firmware of the SOC 206) can associate the error-containing data with a status indicating the existence of the errors. The status can indicate that the data for a given sector may not be all correct.

If the data cannot be corrected as noted above, the SOC 206 can determine that an outer code approach should be attempted. The SOC 206 can use the outer codes to generate error-correction information. As will be described in more detail below, these outer codes are stored on the magnetic recording media of the data storage device 204.

The SOC 206 may include an outer-code decoder 214, which attempts to correct or validate the error-containing data. For example, the outer-code decoder 214 can use the data storage device's outer code to correct or validate certain symbols representing sectors of error-containing data. Those corrected or validated symbols can then be pinned (e.g., to a high reliability value such as a log likelihood ratio (LLR)) and communicated back to the LDPC decoder 212. The LDPC decoder 212 can use the error-correction information to correct the error-containing data.

The process described above can be repeated multiple times (e.g., can be iterative, hence the term iterative outer codes). For example, after the LDPC decoder 212 receives the error-correction information, the LDPC decoder 212 can send the (now smaller set of) uncorrected data back to the controller 206. The controller 206 can then attempt to pin additional symbols and send them to the outer-code decoder 214, which can use the pinned symbols to recover additional sectors of data. In certain embodiments, the process will be repeated until a threshold number of sectors are recovered, until the process is attempted a certain number of times, or until an iteration does not result in any additional pinned symbols. Once the process stops iterative, the combined read and recovered packet of data can be communicated outside the data storage device 204.

Figure 5:
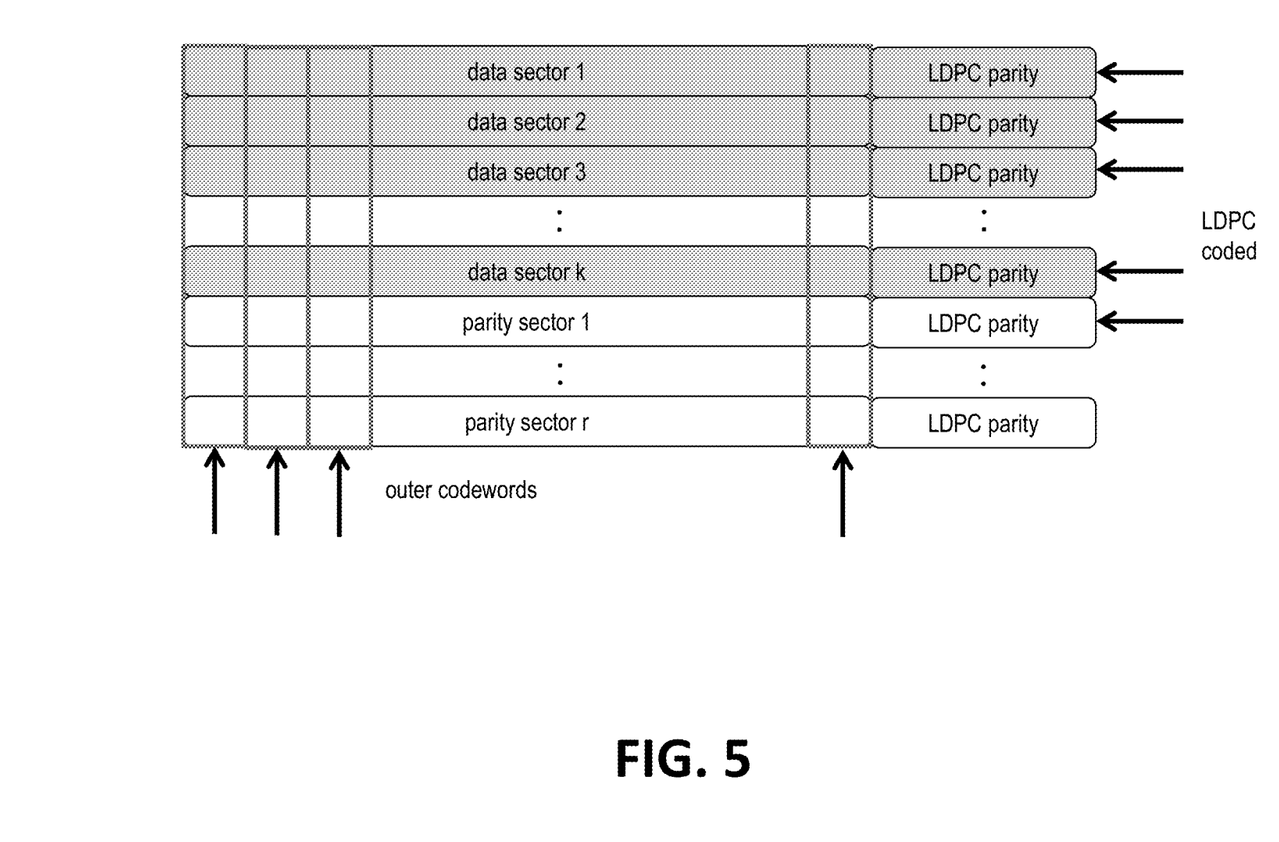
FIG. 5 shows a schematic representation of an error correction approach managed by the host of FIG. 2, in accordance with certain embodiments of the present disclosure.

To visually depict the error correction approach described above in a different way, FIG. 5 shows a schematic representation of the error correction approach. Each row in the schematic of FIG. 5 represents a different data sector of the data storage device 204.

After reading data from a magnetic recording medium, the data storage devices 204 may attempt—among other things—to use its LDPC decoder 212 to process (e.g., decode) and correct the data from the magnetic recording media. However, the number or extent of detected errors in the read data may exceed the capability of the LDPC decoder 212 to reliably correct each of the errors. As such, sectors associated with the uncorrected errors can be collected and communicated to the outer-code decoder 214.

As noted above, the outer-code decoder 214 can use the data storage device's outer code to correct and/or validate the previously uncorrected errors. Information about these corrected and/or validated data can be sent back to the data LDPC decoder 212 for incorporation with the data successfully decoded previously. In the example of FIG. 5, the outer code is used to correct and/or validate symbols along the vertical direction while the LDPC code is used to correct and/or validate symbols along the horizontal direction.

Outer Code Maintenance

As noted above, over time, the effectiveness of outer codes can decrease unless the outer codes are updated to maintain parity when new data is stored to the magnetic recording media (e.g., when stored data is modified or when data is completely new). Updating the outer codes typically involves reading certain sections of the outer codes, then modifying the outer codes, and then overwriting the previous outer codes with the new outer codes. An outer code can be updated without reading all outer code sectors in two possible ways. First, read the portion of the outer code that needs to be rewritten; then read the parity sectors; and, finally, use the new data to be written and the read outer code and parity sectors to generate the new parity sectors. Second, read the data that does not need to be rewritten; then read parity sectors; and, finally, use the new data to be written together with read data to generate revised parity sectors.

This maintenance of parity can consume resources (e.g., processing power and time) of data storage devices which can negatively affect performance of the data storage devices. As such, there is a tension between maintaining parity of outer codes for error-correction performance and devoting resources to incoming read and write commands of user data.

One approach to assist with outer code maintenance is formatting respective outer code segments to be the same as the host's outer code segments. Specifically, the number of sectors (e.g., the length) of a data storage device's outer code can be the same as the number of sectors (e.g., the length) of the host's RAID chunk size.

Figure 6:
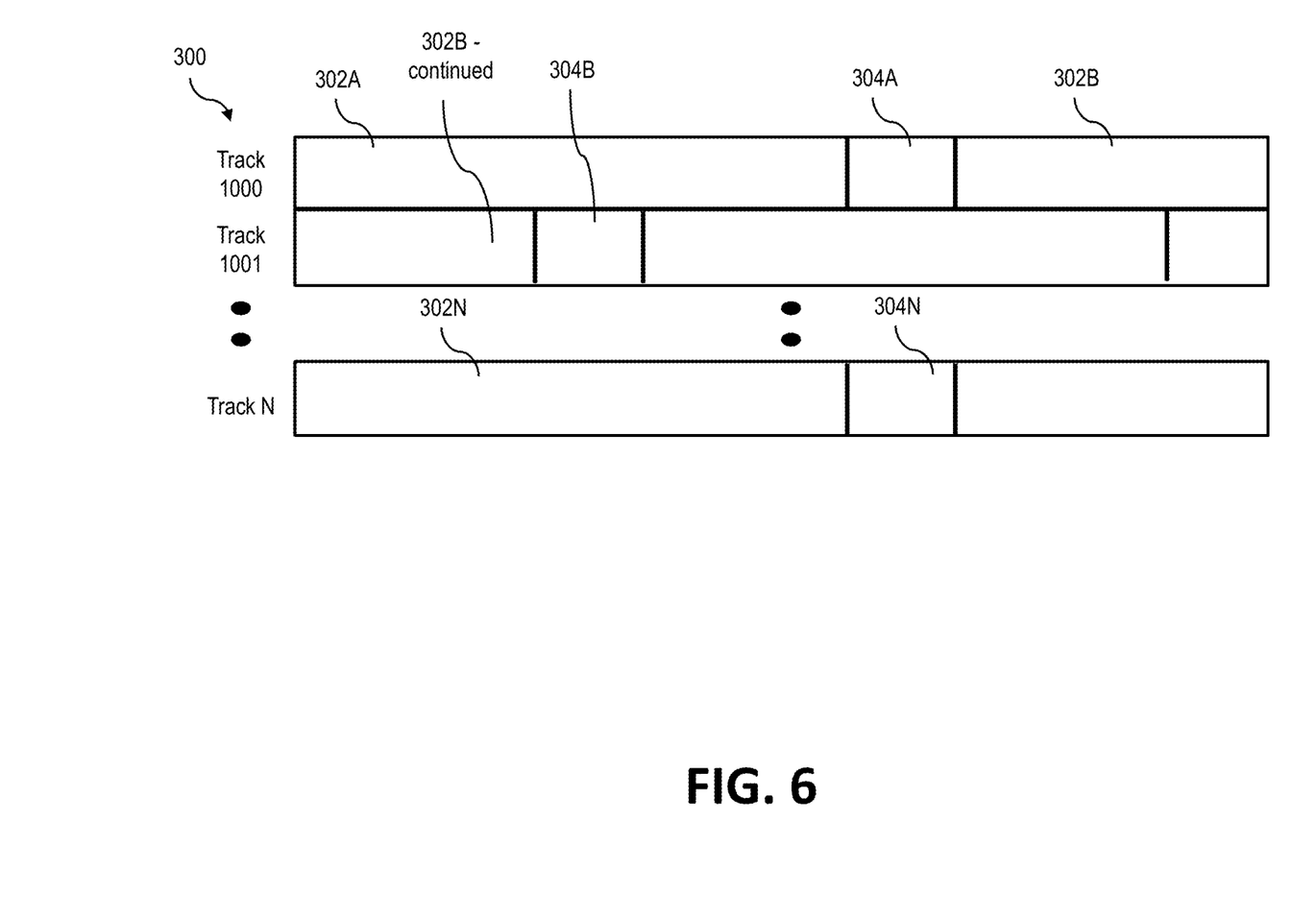
FIG. 6 shows a schematic representation of data tracks in ribbon form, in accordance with certain embodiments of the present disclosure.

FIG. 6 shows an example of this approach, where each data track 300 includes a data portion 302A-302N and a parity portion 304A-304N. The parity portions 304A-304N have the same length (e.g., 512K as one example) as the length of the host's parity portions. This approach is different than—for example—formatting the outer code of a given data track to be proportional to the amount of actual number of data sectors of that data track (e.g., one parity sector for every 250 non-parity sectors). As such, under this approach, the parity information written to the parity portion of a data track may be associated with a data sector written to another data track or may be associated with multiple data sectors written to multiple different tracks. For example, in FIG. 6, a second parity portion 304B is associated with data written to two data tracks (tracks 1000 and 1001 in FIG. 6).

Using the above-described approach, the host system can more easily help to update the outer code of data storage devices in connection with host system operations.

For example, when the host system performs a FSW operation, the host system can write the full outer code length in the data storage device which helps ensure that the outer parity can be calculated and written out sequentially.

PSW operations can be handled differently. In a PSW operation, to keep the host RAID system valid, the relevant already-written data on the magnetic recording media of the data storage device will be read first. In certain embodiments, the read data is temporarily stored to cache memory/buffers of the data storage device. In connection with reading this data, the data storage device can be programmed (e.g., via its SOC) to read associated data needed to update the relevant outer code.

For example, the data storage device can read the entire outer codeword (or, to be more efficient, only parity sectors or an incremental parity derivative) in connection with reading the user data requested by the host system. The read codeword can be stored to cache memory/buffers. As such, all of the outer code sector content can be readily available in cache when the data storage device receives the write command (i.e., the "W" of PSW) with updated data from the host system.

Additionally or alternatively, after the requested data is read (and saved to cache memory), the entire codeword (or remaining codeword) associated with the requested data can be read when the data storage device reaches an idle time, which is when the data storage device has completed all current host commands. For example, for read commands associated with a PSW operation, the data storage device can be programmed to read existing parity associated with those read commands and store the read parity to cache memory, once the data storage device reaches an idle time.

To assist with such approaches for PSW operations, the data storage device can be programmed to distinguish between a normal read request and a read request associated with a PSW operation. For example, the read command from the host system (e.g., a read command over a SAS or SATA interface) can include a flag or other indicator that informs the data storage device that the read command is associated with a PSW operation. As noted above, when such a read command is received, the data storage device can be programmed to not only read the requested data but to store the read data in memory/buffers and be prepared for the data to be written soon.

In connection with receiving the to-be-written data, the data storage device can be programmed to update parity of the outer code. In certain embodiments, the data associated with the received write command is stored to cache memory. That data is used by the data storage device to compute new parity for the outer codeword. For example, the data associated with the received write command can be used in conjunction with previously cached read or parity data to compute the new parity for the data storage device's outer codeword.

The updated parity can be stored to cache memory and subsequently written to the magnetic recording media. For example, the data storage device may be programmed to write the updated parity in batches to reduce overall access and transfer time of the parity. Additionally or alternatively, the data storage device can complete the parity update during an idle period of the data storage device. As another example, the updated parity can be written to the magnetic recording media by extending the write command. Extending the write command may involve skipping any unwritten data sectors between the last received host LBA and the first parity sector.

In certain embodiments, in connection with a PSW operation, the data storage device is programmed to update all sector data for the affected outer code word. In other embodiments, for increased efficiency, the data storage device is programmed to only update the section of the outer code word affected by the PSW operation (e.g., affected by the new or modified data).

As described in the examples above, outer codes of the data storage device can be maintained (e.g., updated) in connection with other operations. As such, the data storage device does not necessarily perform operations dedicated to just maintaining outer codes and/or performs outer code maintenance during idle periods to limit negatively affecting user data read and write commands.

Figure 7:
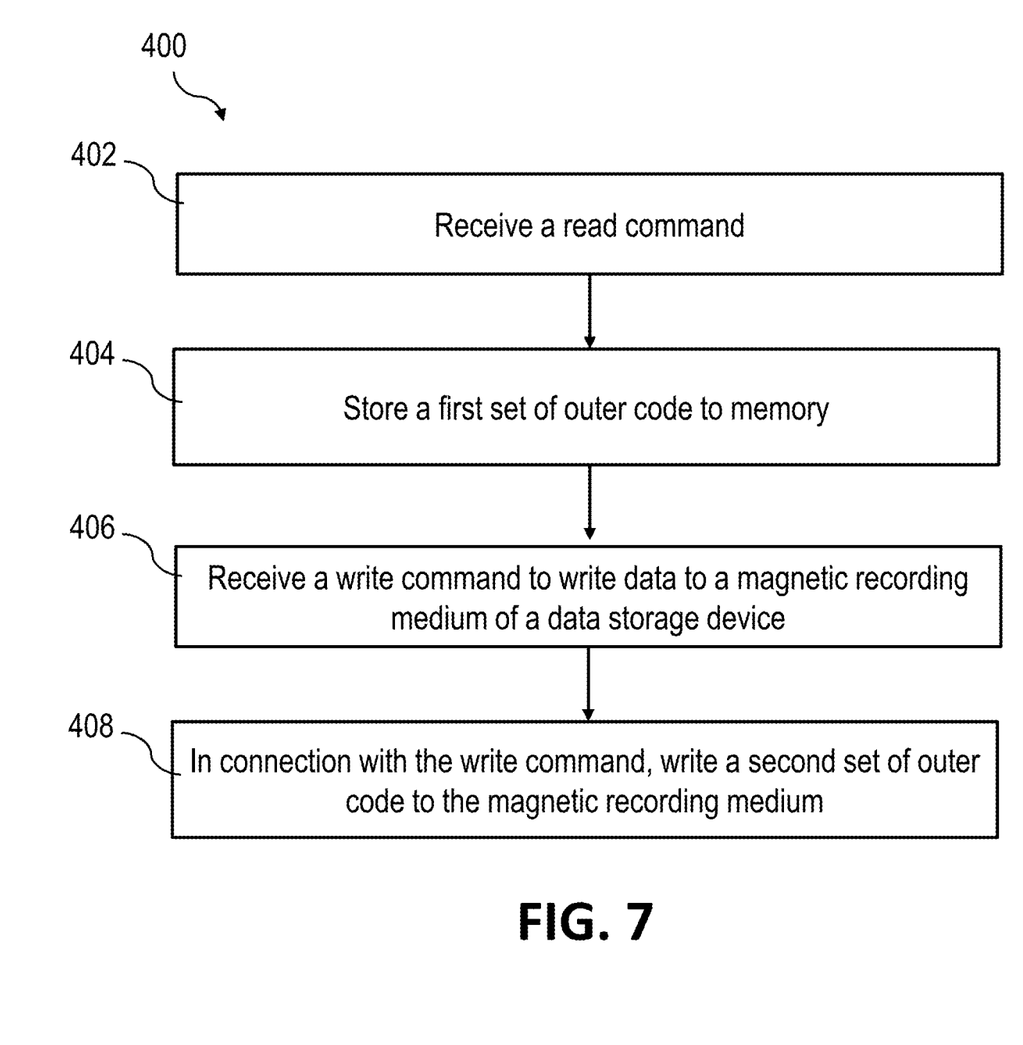
FIG. 7 shows a block diagram of an error correction method, in accordance with certain embodiments of the present disclosure.

FIG. 7 shows a block diagram of a method 400 for writing outer code to a data storage device. The method 400 includes receiving, by a data storage device, a read command (block 402 in FIG. 7). The method 400 further includes reading a first set of outer code stored to a magnetic recording medium of the data storage device and storing the first set of outer code to memory (block 404 in FIG. 7). The method 400 further includes receiving a write command to write data to the magnetic recording medium (block 406 in FIG. 7) and writing a second set of outer code to the magnetic recording medium in connection with the write command (block 408 in FIG. 7).

Referring back to the controllers described above (e.g., the controllers of FIGS. 1 and 4), these controllers can include or be coupled to various computing-related components. For example, the controllers may include a bus that, directly and/or indirectly, couples one or more of the following devices: processor(s), memory, and input/output interface(s). In embodiments, the memory stores computer-executable instructions for causing the processor to perform aspects of embodiments described herein. The computer-executable instructions may include, for example, computer code, machine-useable instructions, and the like such as, for example, program components capable of being executed by one or more processors associated with the controllers. Program components may be programmed using any number of different programming environments, including various languages, development kits, frameworks, and/or the like. Some or all of the functionality contemplated herein may also, or alternatively, be implemented in hardware and/or firmware. In certain embodiments, the processor, memory, and instructions are part of an application specific integrated circuit (ASIC), field-programmable gate array (FPGA), and the like.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A method comprising:
   receiving, by a data storage device, a read command;
   in response to the read command, reading a first set of outer code stored to a magnetic recording medium of the data storage device;
   storing the first set of outer code to memory;
   receiving, by the data storage device, a write command to write data to the magnetic recording medium;
   writing the data to a first track of the magnetic recording medium; and
   in connection with the write command, writing a second set of outer code to a second track of the same magnetic recording medium as the first track, wherein the second track is a different track than the first track, wherein second set of outer code includes parity information that is associated with the data written to the first track;
   detecting, by a data detector of the data storage device, an error while reading the data written on the first track;
   correcting, by an outer-code decoder of the data storage device, the error using the second set of outer code; and
   generating, by the outer-code decoder, a reliability value based on using the second set of outer code, wherein the data detector uses the reliability value to correct the error.

2. The method of claim 1, further comprising:
   receiving, by the data storage device, the data; and
   generating the second set of outer code based, at least in part, on the data and the first set of outer code.

3. The method of claim 1, wherein the read command includes an indicator associated with a partial stripe write.

4. The method of claim 3, wherein the reading the first set of outer code is in response to receiving the indicator.

5. The method of claim 1, wherein the writing the second set of outer code to the magnetic recording medium comprises: overwriting at least a portion of the first set of outer code.

6. The method of claim 1, wherein the outer codes are Reed Solomon codes.

7. The method of claim 1, wherein a length of a sector is equal in length to a predefined data chunk of a host data storage system, wherein the sector only includes the second set of outer code and does not include the data written to the first track.

8. The method of claim 1, wherein the reading the first set of outer code occurs during an idle time, wherein the idle time is when the data storage device has completed all pending host commands.

9. The method of claim 8, wherein the storing the first set of outer code occurs during the idle time, wherein the memory is cache memory.

10. A system-on-a-chip (SOC) comprising:
a read/write channel including a data detector and an outer-code decoder, the read/write channel configured to:
receive a read command for a first set of user data stored to a magnetic recording medium,
in response to the read command, store the first set of user data in memory and store outer code associated with the user data in the memory,
receive a write command for a second set of user data,
generate updated outer code based, at least in part, on the first and second sets of user data and the outer code,
detect, using the data detector, an error while attempting to read the second set of user data, and
correct, using the outer-code decoder, the error using the updated outer code, wherein the outer-code decoder is configured to generate a reliability value based on using the updated outer code.

11. The SOC of claim 10, wherein the read command includes an indicator associated with a partial stripe write.

12. The SOC of claim 11, wherein the first set of user data and the outer code associated with the user data is stored to the memory in response to receiving the indicator.

13. The SOC of claim 10, wherein the read/write channel is configured to cause the generated updated outer code to be written to the magnetic recording medium.

14. The SOC of claim 10, wherein the read/write channel is configured to cause the generated updated outer code to overwrite at least a portion of the outer code associated with the first set of user data.

15. The SOC of claim 10, wherein the outer code comprises Reed Solomon codes.

16. The SOC of claim 10, wherein the updated outer code is assigned to a first data track on the magnetic recording medium, wherein the second set of user data associated with the updated outer code is assigned to a different data track on the magnetic recording medium.

17. The SOC of claim 10, wherein the outer-code decoder is a low-density parity check decoder.

18. The SOC of claim 10, wherein the data detector is configured to use the reliability value to correct the error.

* * * * *